(12) United States Patent
Nakada et al.

(10) Patent No.: US 11,967,348 B2
(45) Date of Patent: Apr. 23, 2024

(54) MAGNETORESISTANCE EFFECT ELEMENT CONTAINING HEUSLER ALLOY WITH ADDITIVE ELEMENT

(71) Applicant: TDK CORPORATION, Tokyo (JP)

(72) Inventors: Katsuyuki Nakada, Tokyo (JP); Kazuumi Inubushi, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/019,919

(22) PCT Filed: Dec. 21, 2020

(86) PCT No.: PCT/JP2020/047677
§ 371 (c)(1),
(2) Date: Feb. 6, 2023

(87) PCT Pub. No.: WO2022/137284
PCT Pub. Date: Jun. 30, 2022

(65) Prior Publication Data
US 2023/0292625 A1    Sep. 14, 2023

(51) Int. Cl.
*G11B 5/39* (2006.01)
*G01R 33/09* (2006.01)
*H10N 50/10* (2023.01)
*H10N 50/85* (2023.01)

(52) U.S. Cl.
CPC .......... *G11B 5/3906* (2013.01); *G01R 33/093* (2013.01); *H10N 50/10* (2023.02); *H10N 50/85* (2023.02); *G11B 2005/3996* (2013.01)

(58) Field of Classification Search
None
See application file for complete search history.

(56) References Cited

U.S. PATENT DOCUMENTS

| | | | |
|---|---|---|---|
| 6,876,522 B2 | 4/2005 | Ambrose et al. | |
| 10,777,247 B1 | 9/2020 | Sun | |
| 11,362,269 B2 | 6/2022 | Cai et al. | |
| 2002/0159203 A1* | 10/2002 | Saito et al. | G11B 5/3903 360/324.2 |
| JP 2007-324269 | 12/2007 | | |
| JP 2010-141340 | 6/2010 | | |
| JP 2012-190914 | 10/2012 | | |
| JP 2013-247198 | 12/2013 | | |

(Continued)

FOREIGN PATENT DOCUMENTS

| JP | 2005-085286 A | 3/2005 |
|---|---|---|
| JP | 2007-250977 A | 9/2007 |

(Continued)

OTHER PUBLICATIONS

Aug. 31, 2023 Office Action issued in U.S. Appl. No. 17/124,643.

(Continued)

*Primary Examiner* — Craig A. Renner
(74) *Attorney, Agent, or Firm* — Oliff PLC

(57) ABSTRACT

This magnetoresistance effect element includes a first ferromagnetic layer, a second ferromagnetic layer, and a nonmagnetic layer provided between the first ferromagnetic layer and the second ferromagnetic layer. At least one of the first ferromagnetic layer and the second ferromagnetic layer has an alloy obtained by adding an additive element to a Heusler alloy. The additive element is any one or more elements selected from the group consisting of H, He, N, O, F, Ne, P, Cl, Ar, Kr, and Xe.

16 Claims, 7 Drawing Sheets

(56) References Cited

U.S. PATENT DOCUMENTS

| | | |
|---|---|---|
| 2007/0217087 A1 | 9/2007 | Hirata et al. |
| 2010/0149863 A1 | 6/2010 | Lee et al. |
| 2011/0129691 A1 | 6/2011 | Ishiwata et al. |
| 2011/0207240 A1 | 8/2011 | Lim et al. |
| 2013/0313506 A1 | 11/2013 | Murayama et al. |
| 2015/0078070 A1 | 3/2015 | Quinsat et al. |
| 2017/0221577 A1 | 8/2017 | Choe |
| 2018/0301621 A1 | 10/2018 | Sato et al. |
| 2019/0019942 A1 | 1/2019 | Nakada et al. |
| 2019/0074430 A1 | 3/2019 | Shiokawa et al. |
| 2019/0088395 A1 | 3/2019 | Ota et al. |
| 2019/0189172 A1* | 6/2019 | Higo et al. ............... G11C 11/16 |
| 2019/0355898 A1 | 11/2019 | Nakada |

FOREIGN PATENT DOCUMENTS

| | | |
|---|---|---|
| JP | 5441005 B2 | 3/2014 |
| JP | 2015-060609 A | 3/2015 |
| JP | 2017-097935 A | 6/2017 |
| JP | 6204769 B2 | 9/2017 |
| JP | 2019-021751 A | 2/2019 |
| JP | 2019-046976 A | 3/2019 |
| JP | 2019-047120 A | 3/2019 |
| JP | 2019-201095 A | 11/2019 |
| WO | 2017/208653 A1 | 12/2017 |

OTHER PUBLICATIONS

Goripati et al., "Bi-quadratic interlayer exchange coupling in Co2MnSi/Ag/Co2MnSi pseudo spin-valve", Journal of Applied Physics, vol. 110, 123914 (2011).

Furubayashi et al., "Structure and transport properties of current-perpendicular-to-plane spin valves using Co2FeAl0.5Si0.5 and Co2MnSi Heusler alloy electrodes", Journal of Applied Physics, vol. 107, 113917 2010.

Kasai et al., "Large magnetoresistance in Heusler-alloy-based epitaxial magnetic junctions with semiconducting Cu (In0.8Ga0.2)Se2 spacer", Applied Physics Letters, vol. 109, 032409 (2016).

Wen et al., "Fully epitaxial C1b-type NiMnSb half-Heusler alloy films for current-perpendicular-to-plane giant magnetoresistance devices with a Ag spacer", scientific reports, 5:18387, DOI: 10.1038/srep18387, 2015.

Galanakis et al., "Electronic structure and Slater-Pauling behaviour in half-metallic Heusler alloys calculated from first principles", J. Phys. D: Appl. Phys., vol. 39, (2006) 765-775.

Kwon et al., "Anisotropic magnetoresistance and current-perpendicular-to-plane giant magnetoresistance in epitaxial NiMnSb-based multilayers", Journal of Applied Physics, vol. 119, 023902 (2016).

Choi et al., "Enhancement of current-perpendicular-to-plane giant magnetoresistance by insertion of amorphous ferromagnetic underlayer in Heusler alloy-based spin-valve structures", Applied Physics Express, vol. 10, 013006 (2017).

Guchang Han et al., "Control of offset field and pinning stability in perpendicular magnetic tunnelling junctions with synthetic antiferromagnetic coupling multilayer", Journal of Applied Physics, vol. 117, 17B515 (2015).

U.S. Appl. No. 17/124,643, filed Dec. 17, 2020 in the name of Minoru Ota et al.

Mar. 16, 2021 Search Report Issued in International Patent Application No. PCT/JP2020/047677.

Nov. 15, 2022 Office Action issued in U.S. Appl. No. 17/141,347.

* cited by examiner

MAGNETORESISTANCE EFFECT ELEMENT CONTAINING HEUSLER ALLOY WITH ADDITIVE ELEMENT

TECHNICAL FIELD

The present invention relates to a magnetoresistance effect element.

BACKGROUND ART

A magnetoresistance effect element is an element in which a resistance value in a lamination direction changes due to a magnetoresistance effect. A magnetoresistance effect element includes two ferromagnetic layers and a nonmagnetic layer sandwiched therebetween. A magnetoresistance effect element in which a conductor is used as a nonmagnetic layer is referred to as a giant magnetoresistance (GMR) element, and a magnetoresistance effect element in which an insulation layer (a tunnel bather layer or a bather layer) is used as a nonmagnetic layer is referred to as a tunnel magnetoresistance (TMR) element. Magnetoresistance effect elements can be applied to various uses such as, magnetic sensors, high-frequency components, magnetic heads, and nonvolatile random-access memories (MRAMs).

Patent literature 1 discloses a magnetoresistance effect element using a Heusler alloy to which one or more kinds of additive elements having a Debye temperature of 300 K or lower have been added.

CITATION LIST

Patent Literature

[Patent Literature 1]
Japanese Unexamined Patent Application, First Publication No. 2007-250977

SUMMARY OF INVENTION

Technical Problem

Patent literature 1 does not disclose a specific MR ratio of a magnetoresistance effect element. In addition, without being limited to the method of Patent literature 1, it is required to improve the MR ratio of a magnetoresistance effect element by improving magnetic characteristics of ferromagnetic layers.

The present invention has been made in consideration of the foregoing circumstances, and an object thereof is to provide a magnetoresistance effect element having a high MR ratio.

Solution to Problem

In order to resolve the foregoing problems, the present invention provides the following means.

(1) A magnetoresistance effect element according to a first aspect includes a first ferromagnetic layer, a second ferromagnetic layer, and a nonmagnetic layer provided between the first ferromagnetic layer and the second ferromagnetic layer. At least one of the first ferromagnetic layer and the second ferromagnetic layer has an alloy obtained by adding an additive element to a Heusler alloy. The additive element is any one or more elements selected from the group consisting of H, He, N, O, F, Ne, P, Cl, Ar, Kr, and Xe.

(2) In the magnetoresistance effect element according to the foregoing aspect, both the first ferromagnetic layer and the second ferromagnetic layer may have an alloy obtained by adding the additive element to the Heusler alloy.

(3) In the magnetoresistance effect element according to the foregoing aspect, the additive element included in the first ferromagnetic layer and the additive element included in the second ferromagnetic layer may differ from each other.

(4) In the magnetoresistance effect element according to the foregoing aspect, the first ferromagnetic layer and the second ferromagnetic layer may differ from each other in concentration of the additive element contained therein.

(5) In the magnetoresistance effect element according to the foregoing aspect, the first ferromagnetic layer and the second ferromagnetic layer may differ from each other in the number of kinds of the additive elements contained therein.

(6) In the magnetoresistance effect element according to the foregoing aspect, the additive element may be any one or more elements selected from the group consisting of N, O, F, Ar, Kr, and Xe.

(7) In the magnetoresistance effect element according to the foregoing aspect, the alloy may be an interstitial solid solution in which the additive element has permeated within a crystal lattice of the Heusler alloy.

(8) In the magnetoresistance effect element according to the foregoing aspect, the alloy may include the additive element at a ratio of 0.4% to 6.3% of the total molar ratio.

(9) In the magnetoresistance effect element according to the foregoing aspect, the alloy may include a region of any space group of Fm-3m, Pm-3m, F-43m, I4/mmm, and P4/mmm.

(10) In the magnetoresistance effect element according to the foregoing aspect, the nonmagnetic layer may include a metal or an alloy including any element selected from the group consisting of Cu, Au, and Ag.

(11) In the magnetoresistance effect element according to the foregoing aspect, the nonmagnetic layer may include the additive element.

(12) In the magnetoresistance effect element according to the foregoing aspect, the Heusler alloy may be expressed by $Co_2Fe_{\beta 1}Ga_{\beta 2}Ge_{\beta 3}$ ... (1). $2.3 \leq \beta 1+\beta 2+\beta 3 \leq 3.0$, $\beta 1 < \beta 2+\beta 3$, $0.5 < \beta 1 < 1.9$, $0.1 \leq \beta 2 \leq 0.8$, and $0.1 \leq \beta 3 \leq 1.5$ may be satisfied in Expression (1).

(13) In the magnetoresistance effect element according to the foregoing aspect, the Heusler alloy may be expressed by $(Mn_{1-x}Co_x)_y Ge_{1-y}$ ... (2). Expression (2) may satisfy $0 \leq x \leq \frac{1}{3}$ and $\frac{1}{2} < y \leq \frac{3}{4}$.

(14) In the magnetoresistance effect element according to the foregoing aspect, an intermediate layer including a NiAl alloy may be provided between at least one of the first ferromagnetic layer and the second ferromagnetic layer, and the nonmagnetic layer.

(15) In the magnetoresistance effect element according to the foregoing aspect, a thickness of the intermediate layer may be 0.63 nm or shorter.

Advantageous Effects of Invention

The magnetoresistance effect element according to the present invention exhibits a high MR ratio.

DESCRIPTION OF EMBODIMENT

Hereinafter, the present embodiment will be described in detail suitably with reference to the drawings. In drawings used in the following description, in order to make characteristics of the present embodiment easy to understand, characteristic portions may be illustrated in an enlarged manner for the sake of convenience, and dimensional ratios or the like of each constituent element may differ from actual values thereof. Exemplary materials, dimensions, and the like illustrated in the following description are merely examples. The present invention is not limited thereto and can be suitably changed and performed within a range in which the gist thereof does not change.

First Embodiment

Figure 1:
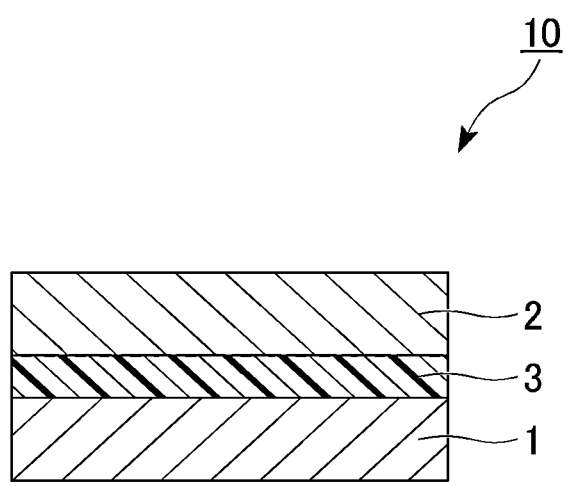
FIG. 1 is a cross-sectional view of a magnetoresistance effect element according to a first embodiment.

FIG. 1 is a cross-sectional view of a magnetoresistance effect element according to a first embodiment. First, directions will be defined. A direction in which each layer is laminated may be referred to as a lamination direction. In addition, a direction which intersects the lamination direction and in which each layer extends may be referred to as an in-plane direction.

A magnetoresistance effect element 10 illustrated in FIG. 1 includes a first ferromagnetic layer 1, a second ferromagnetic layer 2, and a nonmagnetic layer 3. The nonmagnetic layer 3 is provided between the first ferromagnetic layer 1 and the second ferromagnetic layer 2. Hereinafter, when the first ferromagnetic layer 1 and the second ferromagnetic layer 2 are not individually distinguished from each other, they may be simply referred to as ferromagnetic layers.

The magnetoresistance effect element 10 outputs a change of a relative angle between a magnetization of the first ferromagnetic layer 1 and a magnetization of the second ferromagnetic layer 2 as a resistance value change. For example, the magnetization of the second ferromagnetic layer 2 is easier to move than the magnetization of the first ferromagnetic layer 1. When a predetermined external force is applied, the direction of the magnetization of the first ferromagnetic layer 1 does not change (is fixed), and the direction of the magnetization of the second ferromagnetic layer 2 changes. As the direction of the magnetization of the second ferromagnetic layer 2 changes with respect to the direction of the magnetization of the first ferromagnetic layer 1, the resistance value of the magnetoresistance effect element 10 changes. In this case, the first ferromagnetic layer 1 may be referred to as a magnetization fixed layer, and the second ferromagnetic layer 2 may be referred to as a magnetization free layer. In order to enhance stability of the magnetization, the first ferromagnetic layer 1 is preferably provided on a substrate side below the second ferromagnetic layer 2.

In the following description, the first ferromagnetic layer 1 serves as a magnetization fixed layer and the second ferromagnetic layer 2 serves as a magnetization free layer, but this relationship may be reversed. In addition, since the magnetoresistance effect element 10 outputs a change of the relative angle between the magnetization of the first ferromagnetic layer 1 and the magnetization of the second ferromagnetic layer 2 as a resistance value change, a constitution in which both the magnetization of the first ferromagnetic layer 1 and the magnetization of the second ferromagnetic layer 2 move (that is, both the first ferromagnetic layer 1 and the second ferromagnetic layer 2 serve as magnetization free layers) may be adopted.

A difference in easiness of movement between the magnetization of the first ferromagnetic layer 1 and the magnetization of the second ferromagnetic layer 2 when a predetermined external force is applied occurs due to the difference between coercive forces of the first ferromagnetic layer 1 and the second ferromagnetic layer 2. For example, when the first ferromagnetic layer 1 and the second ferromagnetic layer 2 are made of the same material, if the thickness of the second ferromagnetic layer 2 is smaller than the thickness of the first ferromagnetic layer 1, the coercive force of the second ferromagnetic layer 2 becomes smaller than the coercive force of the first ferromagnetic layer 1. In addition, for example, another ferromagnetic layer may be provided on a surface of the first ferromagnetic layer 1 on a side opposite to the nonmagnetic layer 3 via a spacer layer. The first ferromagnetic layer 1, the spacer layer, and the ferromagnetic layer form a synthetic antiferromagnetic structure (SAF structure). A synthetic antiferromagnetic structure is constituted of two ferromagnetic layers sandwiching a spacer layer therebetween. Due to magnetic coupling between the first ferromagnetic layer 1 and the ferromagnetic layer, the coercive force of the first ferromagnetic layer 1 increases compared to when another ferromagnetic layer is not provided. For example, the ferromagnetic layer is made of IrMn, PtMn, or the like. For example, the spacer layer includes at least one selected from the group consisting of Ru, Ir, and Rh.

At least one of the first ferromagnetic layer 1 and the second ferromagnetic layer 2 has an alloy obtained by adding an additive element to a Heusler alloy. Both the first ferromagnetic layer 1 and the second ferromagnetic layer 2 may have an alloy obtained by adding an additive element to a Heusler alloy. Both the first ferromagnetic layer 1 and the second ferromagnetic layer 2 may be constituted of an alloy obtained by adding an additive element to a Heusler alloy.

When one of the first ferromagnetic layer 1 and the second ferromagnetic layer 2 is made of a ferromagnetic material other than a Heusler alloy, for example, the ferromagnetic material may be a metal selected from the group consisting of Cr, Mn, Co, Fe and Ni, an alloy including one or more of these metals, or an alloy including one or more of these metals and at least one kind of element of B, C, and N.

A Heusler alloy is an intermetallic compound having a chemical composition of XYZ or $X_2YZ$. XYZ or $X_2YZ$ is a compositional formula indicated by a stoichiometric composition, and a composition ratio may deviate from the stoichiometric composition within a range in which a crystal structure can be maintained.

A ferromagnetic Heusler alloy expressed by $X_2YZ$ is referred to as a full Heusler alloy, and a ferromagnetic Heusler alloy expressed by XYZ is referred to as a half-Heusler alloy. A half Heusler alloy corresponds to a full Heusler alloy in which some of the X-site atoms are vacant. Both are typically intermetallic compounds based on a bcc structure.

FIG. 2 is an example of a crystal structure of a Heusler alloy. FIG. 2(a) to FIG. 2(c) are examples of crystal structures of full Heusler alloys, and FIG. 2(d) to FIG. 2(f) are examples of crystal structures of half-Heusler alloys.

Figure 2A:
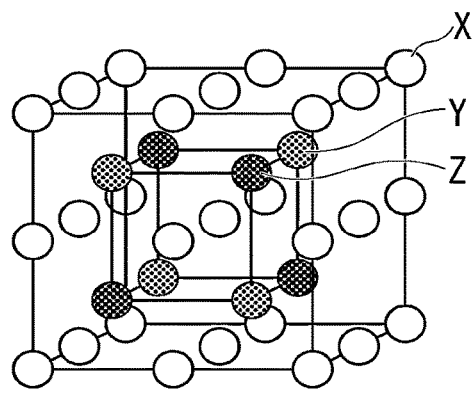
FIGS. 2A-2F are views illustrating a crystal structure of a Heusler alloy.

FIG. 2(a) is referred to as an $L2_1$ structure. In the $L2_1$ structure, elements inserted at X sites, elements inserted at Y sites, and elements inserted at Z sites are fixed. FIG. 2(b) is referred to as a B2 structure derived from the $L2_1$ structure. In the B2 structure, elements inserted at the Y sites and elements inserted at the Z sites are mixed in with each other, and elements inserted at the X sites are fixed. FIG. 2(c) is referred to as an A2 structure derived from the $L2_1$ structure. In the A2 structure, elements inserted at the X sites, elements inserted at the Y sites, and elements inserted at the Z sites are mixed in with each other.

Figure 2D:
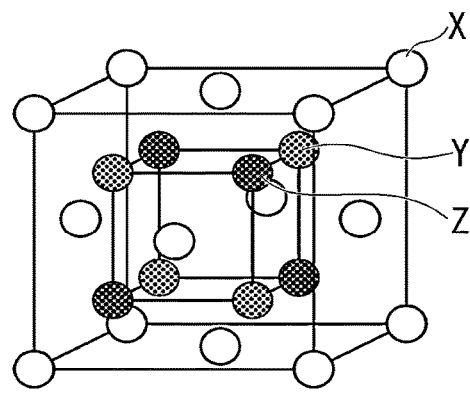
Figure 2B:
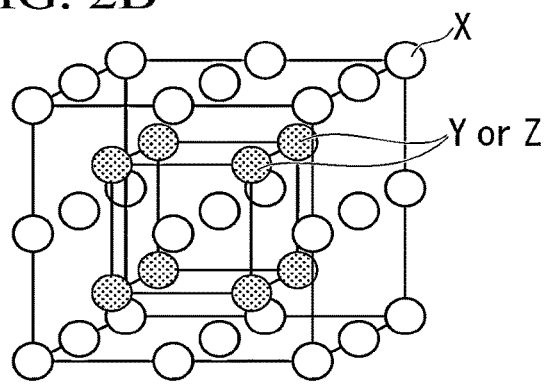
Figure 2E:
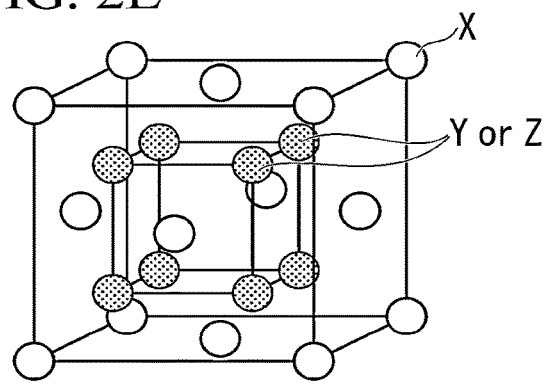
Figure 2C:
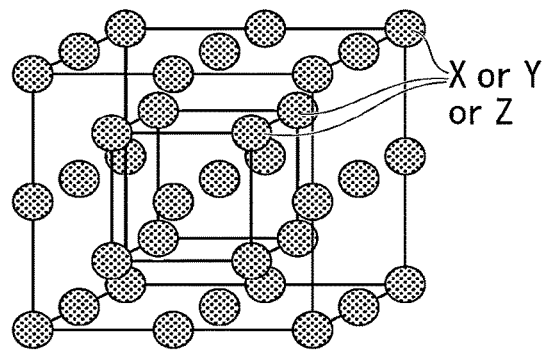
Figure 2F:
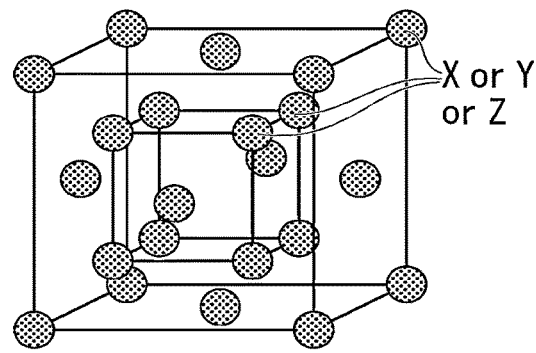

FIG. 2(d) is referred to as a $C1_b$ structure. In the $C1_b$ structure, elements inserted at the X sites, elements inserted at the Y sites, and elements inserted at the Z sites are fixed. FIG. 2(e) is referred to as the B2 structure derived from the $C1_b$ structure. In the B2 structure, elements inserted at the Y sites and elements inserted at the Z sites are mixed in with each other, and elements inserted at the X sites are fixed. FIG. 2(f) is referred to as the A2 structure derived from the $C1_b$ structure. In the A2 structure, elements inserted at the X sites, elements inserted at the Y sites, and elements inserted at the Z sites are mixed in with each other.

X is an element of one or more kinds selected from Co, Ir, Rh, Pt, Cu, and Mn. Y is an element of one or more kinds selected from V, Cr, Mn, Fe, and Co. Z is an element of one or more kinds selected from Al, Si, Ge, Ga, As, Sb, Bi, In, Ti, and Pb.

For example, a basic skeleton of a Heusler alloy is expressed by $Co_2Fe_{\beta1}Ga_{\beta2}Ge_{\beta3}$ ... (1). $2.3 \leq \beta1+\beta2+\beta3 \leq 3.0$, $\beta1 < \beta2+\beta3$, $0.5 < \beta1 < 1.9$, $0.1 \leq \beta2 \leq 0.8$, and $0.1 \leq \beta3 \leq 1.5$ are satisfied in Expression (1).

If $2.3 \leq \beta1+\beta2+\beta3$ is satisfied, the composition ratio of Co is relatively smaller than the total composition ratio of the elements at the Y sites and the Z sites. If the composition ratio of Co is relatively smaller than the elements at the Y sites and the Z sites, anti-sites where the elements at the Y sites or the Z sites are substituted by the elements at the X sites (sites where Co is inserted) can be suppressed. Anti-sites shift the fermi level of a Heusler alloy. If the fermi level shifts, half metal properties of a Heusler alloy are degraded, and a spin polarization coefficient decreases. Decrease of the spin polarization coefficient causes decrease of an MR ratio of the magnetoresistance effect element 10.

In addition, for example, the basic skeleton of the Heusler alloy may be expressed by $(Mn_{1-x}Co_x)_yGe_{1-y}$ ... (2). Expression (2) satisfies $0 \leq x \leq \frac{1}{3}$ and $\frac{1}{2} \leq y \leq \frac{3}{4}$.

In Expression (2), if $0 \leq x \leq \frac{1}{3}$ and $\frac{1}{2} \leq y \leq \frac{3}{4}$ are satisfied, the Heusler alloy will have a structure in which the $L2_1$ structure is transformed into a tetragonal crystal. For example, in the case of $\frac{1}{2} \leq y \leq \frac{2}{3}$, the Heusler alloy has an $L1_0$ structure (the space group is P4/mmm), and in the case of $\frac{2}{3} < y \leq \frac{3}{4}$, the Heusler alloy has a $D0_{22}$ structure (the space group is I4/mmm). In either case in which the crystal structure is the $L1_0$ structure or the $D0_{22}$ structure, the Heusler alloy have perpendicular magnetic anisotropy. To obtain a high MR ratio, the crystal structure should be the $D0_{22}$ structure in which allows for a high spin polarization coefficient of the Heusler alloy.

In addition, the Heusler alloy may be $(Mn_{1-x}Fe_x)_yGe_{1-y}$, $(Mn_{1-x}Fe_x)_yGa_{1-y}$, or $(Mn_{1-x}Co_x)_yGa_{1-y}$. In all cases, $0 \leq x \leq \frac{1}{3}$ and $\frac{1}{2} \leq y \leq \frac{3}{4}$ are satisfied.

The additive element is any one or more elements selected from the group consisting of H, He, N, O, F, Ne, P, Cl, Ar, Kr, and Xe. These elements change an electronic state density distribution of the Heusler alloy and enhance magnetic characteristics (for example, saturation magnetization) of the entire alloy including the additive element. These elements are elements on the right upper side of the periodic table excluding H, and the elements are likely to permeate into the Heusler alloy and do not significantly change the basic skeleton of the Heusler alloy. For this reason, characteristics can be enhanced while maintaining characteristics of the Heusler alloy such as a large spin polarization coefficient.

Preferably, the additive element is any one or more elements selected from N, O, F, Ar, Kr, and Xe. N, O, and F have high electro-negativity and can significantly change the electronic state density distribution of the Heusler alloy. As a result, the magnetic characteristics of the Heusler alloy (for example, a magnetic moment) can be further enhanced, and the MR ratio of the magnetoresistance effect element 10 is improved. In addition, the elements N, O, and F which may become an additive element are favorable as an additive element in the order of F, N, and O. In addition, Ar, Kr, and Xe are chemically inert and have relatively larger atomic numbers among the current additive elements. For this reason, Ar, Kr, and Xe can significantly change the electronic state density inside the Heusler alloy without significantly change the basic skeleton of the Heusler alloy. As a result, the magnetic characteristics of the Heusler alloy (for example, the magnetic moment) can be further enhanced, and the MR ratio of the magnetoresistance effect element 10 is improved. The elements Ar, Kr, and Xe which may become an additive element are favorable as an additive element in the order of Xe, Kr, and Ar.

The additive element is not present separately from the crystal but present by being incorporated into the crystal structure. The additive element may be present by substituting some of the elements constituting the Heusler alloy or may be present by being incorporated within the crystal lattice constituting the crystal structure. The former is referred to as a substitutional solid solution, and the latter is referred to as an interstitial solid solution. The Heusler alloy is preferably an interstitial solid solution. An interstitial solid solution maintains the basic skeleton of the Heusler alloy and maintains the feature such as a large spin polarization coefficient of the Heusler alloy.

For example, the concentration of the additive element is 0.4% to 6.3% of the total molar ratio of the Heusler alloy, more preferably 0.4% to 4.8%, and still preferably 0.5% to 2.3%. If the additive element is within the range, the degree of order of the basic skeleton of the Heusler alloy can be maintained. The concentration of the additive element is the average value of results of concentration measurement at arbitrary 10 locations inside the layer.

The additive element included in the first ferromagnetic layer 1 and the additive element included in the second ferromagnetic layer 2 may differ from each other. In addition, the first ferromagnetic layer 1 and the second ferromagnetic layer 2 may differ from each other in concentration of the additive element contained therein. In addition, the first ferromagnetic layer 1 and the second ferromagnetic layer 2 may differ from each other in the number of kinds of the additive elements contained therein. For example, the first ferromagnetic layer may include two kinds of elements as additive elements, and the second ferromagnetic layer may include one kind of elements as additive elements. If the first ferromagnetic layer 1 and the second ferromagnetic layer 2 differ from each other in alloy constitution, a coercive force difference is likely to be generated between the first ferromagnetic layer 1 and the second ferromagnetic layer 2. The coercive force difference makes the parallel state or anti-parallel state of the magnetizations of the first ferromagnetic layer 1 and the second ferromagnetic layer 2 stable.

For example, the Heusler alloy includes a region of any space group of Fm-3m, Pm-3m, F-43m, I4/mmm, and P4/mmm. Including a region of a space group denotes that there is no need for all the Heusler alloys to have the space group, some of the Heusler alloys need only have the space group. If the Heusler alloy has the space group, degradation of the half metal properties of the Heusler alloy can be suppressed.

The space group and the crystal structure of the Heusler alloy can be judged from a transmission electron microscopy (TEM) image (for example, a high-angle annular dark field scanning transmission electron microscopy image: HAADF-STEM image) or an electron beam diffraction image using a transmission electron beam. More specifically, they can be obtained from spots appearing in a Fourier-transformed image of a HAADF-STEM image. In addition, the crystal structure of the Heusler alloy can also be measured by X-ray diffraction (XRD), reflection high-energy electron diffraction (RHEED), or the like.

The composition analysis of each of the layers constituting the magnetoresistance effect element can be performed using energy dispersive X-ray spectroscopy (EDS), secondary ion mass spectrometry (SIMS), an atom probe method, or electron energy loss spectroscopy (EELS).

In addition, the composition of the Heusler alloy can be measured by X-ray fluorescence (XRF), inductively coupled plasma (ICP) emission spectral analysis, SIMS, auger electron spectroscopy (AES), an atom probe method, electron energy loss spectroscopy (EELS), or the like.

For example, the nonmagnetic layer 3 is made of a nonmagnetic metal. For example, the nonmagnetic layer 3 is a metal or an alloy including any element selected from the group consisting of Cu, Au, Ag, Al, and Cr. For example, the nonmagnetic layer 3 includes any element selected from the group consisting of Cu, Au, Ag, Al, and Cr as a main constituent element. A main constituent element denotes that the ratio of Cu, Au, Ag, Al, or Cr is 50% or more in a compositional formula. The nonmagnetic layer 3 preferably includes Cu, Au, and Ag and preferably includes Cu, Au, and Ag as main constituent elements. Since Cu, Au, and Ag have a long spin diffusion length, the magnetoresistance effect element 10 using Cu, Au, and Ag exhibits a high MR ratio.

For example, the nonmagnetic layer 3 has a thickness within a range of 1 nm to 10 nm. The nonmagnetic layer 3 inhibits magnetic coupling between the first ferromagnetic layer 1 and the second ferromagnetic layer 2.

The nonmagnetic layer 3 may be an insulator or a semiconductor. For example, a nonmagnetic insulator is made of $Al_2O_3$; $SiO_2$; MgO; $MgAl_2O_4$; or a material in which a part of Al, Si, Mg thereof is substituted with Zn, Be, Ga, In or the like. These materials have a large bandgap and excellent insulation properties. When the nonmagnetic layer 3 is constituted of a nonmagnetic insulator, the nonmagnetic layer 3 is a tunnel barrier layer. For example, a nonmagnetic semiconductor is made of Si, Ge, $CuInSe_2$, $CuGaSe_2$, $Cu(In, Ga)Se_2$, or the like.

The nonmagnetic layer 3 may include an additive element. If the nonmagnetic layer 3 includes an additive element, diffusion of the additive element from the first ferromagnetic layer 1 and the second ferromagnetic layer 2 to the nonmagnetic layer 3 can be suppressed, and degradation of magnetic characteristics of the first ferromagnetic layer 1 and the second ferromagnetic layer 2 can be suppressed.

Next, a method of manufacturing the magnetoresistance effect element 10 will be described. For example, the magnetoresistance effect element 10 is laminated on a substrate. A substrate may have crystallinity or may be amorphous. Examples of a substrate having crystallinity include a metal oxide single crystal, a silicon single crystal, a sapphire single crystal, and a ceramic. Examples of an amorphous substrate include a silicon single crystal with a thermal oxide film, a glass, and a quartz.

A base layer may be formed on a substrate. For example, the base layer is a seed layer for enhancing the crystallinity of an upper layer laminated on the base layer. The base layer may be a buffer layer for alleviating a difference between a lattice constant of the substrate and a lattice constant of the upper layer. The base layer may be a single layer or a plurality of layers. The base layer may be utilized as an electrode for causing a detection current to flow.

Next, the magnetoresistance effect element 10 is obtained by sequentially laminating the first ferromagnetic layer 1, the nonmagnetic layer 3, and the second ferromagnetic layer 2 on the substrate or the base layer and processing these into a predetermined shape. For example, each of the layers can be formed using a sputtering method. For example, a laminated film can be processed by photolithography and etching. A cap layer may be formed on the second ferromagnetic layer 2. The cap layer has functions, such as improving the crystallinity of a lower layer, protecting the second ferromagnetic layer 2, enhancing the perpendicular magnetic anisotropy of the second ferromagnetic layer 2, and the like. For example, the cap layer may be made of a metal, an alloy, or a laminated film of Ru, Ag, Al, Cu, Au, Cr, Mo, Pt, W, Ta, Pd, Ir, or the like, or may be made of MgO or an oxide such as $MgAl_2O_4$.

For example, an additive element is added when at least one of the first ferromagnetic layer 1 and the second ferromagnetic layer 2 is formed. Additive treatment is performed because a sufficient additive element may not be contained in a Heusler alloy by only performing film formation in atmosphere containing an additive element.

For example, additive treatment is performed by injecting an additive element subjected to plasma or ionization during film formation or after film formation of a ferromagnetic layer. A ferromagnetic layer is at least one of the first ferromagnetic layer 1 and the second ferromagnetic layer 2. For example, a reverse sputtering method is one of means for injecting an additive element subjected to plasma. In addition, for example, an ion implantation method is one of means for injecting an ionized additive element. In addition, when an additive element is N or O, the additive element can be added to the ferromagnetic layer using reactive sputtering. In this case, when the first ferromagnetic layer 1 or the second ferromagnetic layer 2 is formed, gas of N, O, or the like is caused to flow into a chamber, and thus a substance generated by a component included in a target constituent substance and gas can be deposited. In addition, during a process of adding an additive element, as necessary, heat treatment may be performed.

Additive treatment using a reverse sputtering method will be described as an example. First, glow discharge is caused by introducing gas including an additive element into a chamber in which a laminate having at least one of the first ferromagnetic layer 1 and the second ferromagnetic layer 2 is installed. An additive element subjected to plasma by glow discharge is incident on at least one of the first ferromagnetic layer 1 and the second ferromagnetic layer 2 due to a potential difference. In ordinary sputtering, gas subjected to plasma is incident toward a target, but an additive element subjected to plasma can be incident on at least one of the first ferromagnetic layer 1 and the second ferromagnetic layer 2 by reversing the potential. The incident additive element is incorporated into at least one of the first ferromagnetic layer 1 and the second ferromagnetic layer 2, and at least one of the first ferromagnetic layer 1 and the second ferromagnetic layer 2 including the additive element is thereby formed.

In addition, additive treatment is not limited to the foregoing method. For example, at least one of the first ferromagnetic layer 1 and the second ferromagnetic layer 2 may be formed using a sputtering target in which an additive element and an element constituting the first ferromagnetic layer 1 or the second ferromagnetic layer 2 are included in advance.

Here, the composition ratio of an additive element is defined by an atomic composition percentage (mol %), that is, 100×"the number of additive element atoms"/("the number of atoms X"+"the number of atoms Y"+"the number of atoms Z"+"the number of additive element atoms"). The composition ratio is calculated using a value from which a background signal of a measurement element is subtracted.

In the magnetoresistance effect element 10 according to the present embodiment, an alloy obtained by adding an additive element to a Heusler alloy is used in a ferromagnetic layer so that while basic characteristics of the Heusler alloy are maintained, the electronic state density distribution of the Heusler alloy can be changed, and the MR ratio of the magnetoresistance effect element 10 can be increased.

In a step of producing the magnetoresistance effect element 10, as necessary, heat treatment may be performed. In addition, as necessary, magnetic field application treatment may be performed, and magnetic anisotropy such as uniaxial magnetic anisotropy may be imparted to the first ferromagnetic layer 1 and/or the second ferromagnetic layer 2. Magnetic field application treatment may be performed together with heat treatment.

Hereinabove, the embodiment of the present invention has been described in detail with reference to the drawings. However, each of the constitutions in each embodiment and combination and the like thereof are examples, and addition, omission, substitution, and other changes of the constitutions can be made within a range not departing from the gist of the present invention.

First Modification Example

Figure 3:
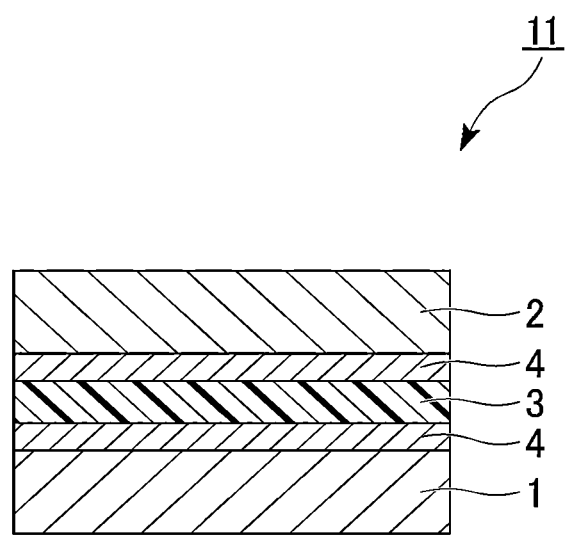
FIG. 3 is a cross-sectional view of a magnetoresistance effect element according to a first modification example.

FIG. 3 is a cross-sectional view of a magnetoresistance effect element 11 according to a first modification example. The magnetoresistance effect element 11 differs from the magnetoresistance effect element 10 in having an intermediate layer 4. The same reference signs are applied to constitutions similar to those of the magnetoresistance effect element 10, and description thereof will be omitted.

The intermediate layer 4 is provided between the first ferromagnetic layer 1 and the nonmagnetic layer 3 and between the second ferromagnetic layer 2 and the nonmagnetic layer 3. The intermediate layer 4 may be provided either between the first ferromagnetic layer 1 and the nonmagnetic layer 3 or between the second ferromagnetic layer 2 and the nonmagnetic layer 3.

For example, the intermediate layer 4 includes a NiAl alloy. The ratios of Ni and Al included in the NiAl alloy may be the same or may be different from each other. For example, the ratios of Ni and Al are within a range of 1:3 to 3:1 in molar ratio. The intermediate layer 4 alleviates lattice mismatch between adjacent layers.

For example, a thickness t of the intermediate layer 4 is $0 \text{ nm} < t \leq 0.63 \text{ nm}$ and is preferably $0.1 \text{ nm} \leq t \leq 0.63 \text{ nm}$. The thicker the intermediate layer 4 is, many spins are scattered by the intermediate layer 4.

For example, the intermediate layer 4 can be formed by co-sputtering of Ni and Al.

The magnetoresistance effect element 11 according to the first modification example exhibits effects similar to those of the magnetoresistance effect element 10. In addition, since the magnetoresistance effect element 11 has the intermediate layer 4, lattice mismatch between layers is alleviated, and the MR ratio of the magnetoresistance effect element 11 is further improved.

The foregoing magnetoresistance effect elements 10 and 11 can be used for various purposes. For example, the magnetoresistance effect elements 10 and 11 can be applied to magnetic heads, magnetic sensors, magnetic storages, high-frequency filters, and the like.

Next, application examples of a magnetoresistance effect element according to the present embodiment will be described. In the following application examples, the magnetoresistance effect element 10 is used as a magnetoresistance effect element, but the magnetoresistance effect element is not limited thereto.

Figure 4:
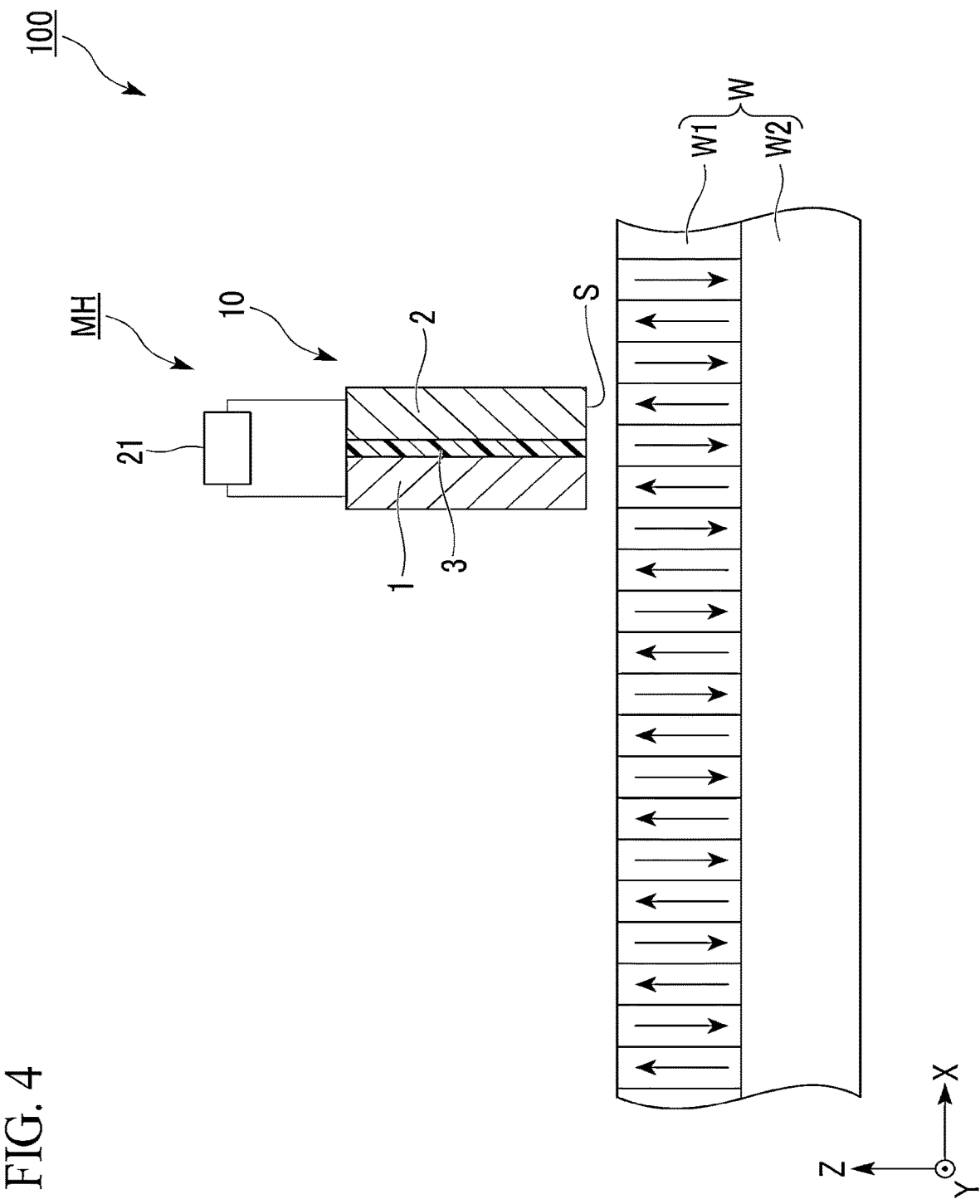
FIG. 4 is a cross-sectional view of a magnetic recording element according to Application example 1.

FIG. 4 is a cross-sectional view of a magnetic recording element 100 according to Application example 1. FIG. 4 is a cross-sectional view of the magnetoresistance effect element 10 cut in the lamination direction.

As illustrated in FIG. 4, the magnetic recording element 100 has a magnetic head MH and a magnetic recording medium W. In FIG. 4, one direction in which the magnetic recording medium W extends will be regarded as an X direction, and a direction perpendicular to the X direction will be regarded as a Y direction. An XY plane is parallel to a main surface of the magnetic recording medium W. A direction in which the magnetic recording medium W and the magnetic head MH are connected to each other and a direction perpendicular to the XY plane will be regarded as a Z direction.

In the magnetic head MH, an air bearing surface (medium facing surface) S faces the surface of the magnetic recording medium W. The magnetic head MH moves in directions of the arrow of positive X and the arrow of negative X along the surface of the magnetic recording medium W at a position away from the magnetic recording medium W with a certain distance therebetween. The magnetic head MH has the magnetoresistance effect element 10 operating as a magnetic sensor and a magnetic recording portion (not illustrated). A resistance measuring instrument 21 measures the resistance value in the lamination direction of the magnetoresistance effect element 10.

The magnetic recording portion applies a magnetic field to a recording layer W1 of the magnetic recording medium W and determines the direction of the magnetization of the recording layer W1. That is, the magnetic recording portion performs magnetic recording of the magnetic recording medium W. The magnetoresistance effect element 10 reads information of the magnetization of the recording layer W1 written by the magnetic recording portion.

The magnetic recording medium W has the recording layer W1 and a backing layer W2. The recording layer W1 is a part for performing magnetic recording, and the backing layer W2 is a magnetic path for refluxing a writing magnetic flux (a path for magnetic flux) to the magnetic head MH again. The recording layer W1 records magnetic information as a direction of the magnetization.

For example, the second ferromagnetic layer 2 of the magnetoresistance effect element 10 is a magnetization free layer. For this reason, the second ferromagnetic layer 2 exposed on the air bearing surface S is affected by the magnetization recorded in the facing recording layer W1 of the magnetic recording medium W. For example, in FIG. 4, the direction of the magnetization of the second ferromagnetic layer 2 is directed in the positive Z direction upon reception of the influence of the magnetization of the recording layer W1 directed in the positive Z direction. In this case, the directions of the magnetizations of the first ferromagnetic layer 1 (magnetization fixed layer) and the second ferromagnetic layer 2 become parallel to each other.

Here, the resistance when the directions of the magnetizations of the first ferromagnetic layer 1 and the second ferromagnetic layer 2 are parallel to each other differs from the resistance when the directions of the magnetizations of the first ferromagnetic layer 1 and the second ferromagnetic layer 2 are anti-parallel to each other. The MR ratio of the magnetoresistance effect element 10 increases as the difference between the resistance value in the case of being parallel and the resistance value in the case of being anti-parallel increases. The magnetoresistance effect element 10 according to the present embodiment includes an alloy obtained by adding an additive element to a Heusler alloy and has a high MR ratio. Therefore, information of the magnetization of the recording layer W1 can be accurately read as a resistance value change by the resistance measuring instrument 21.

The shape of the magnetoresistance effect element 10 of the magnetic head MH is not particularly limited. For example, in order to avoid an influence of a leakage magnetic field of the magnetic recording medium W with respect to the first ferromagnetic layer 1 of the magnetoresistance effect element 10, the first ferromagnetic layer 1 may be disposed at a position away from the magnetic recording medium W.

Figure 5:
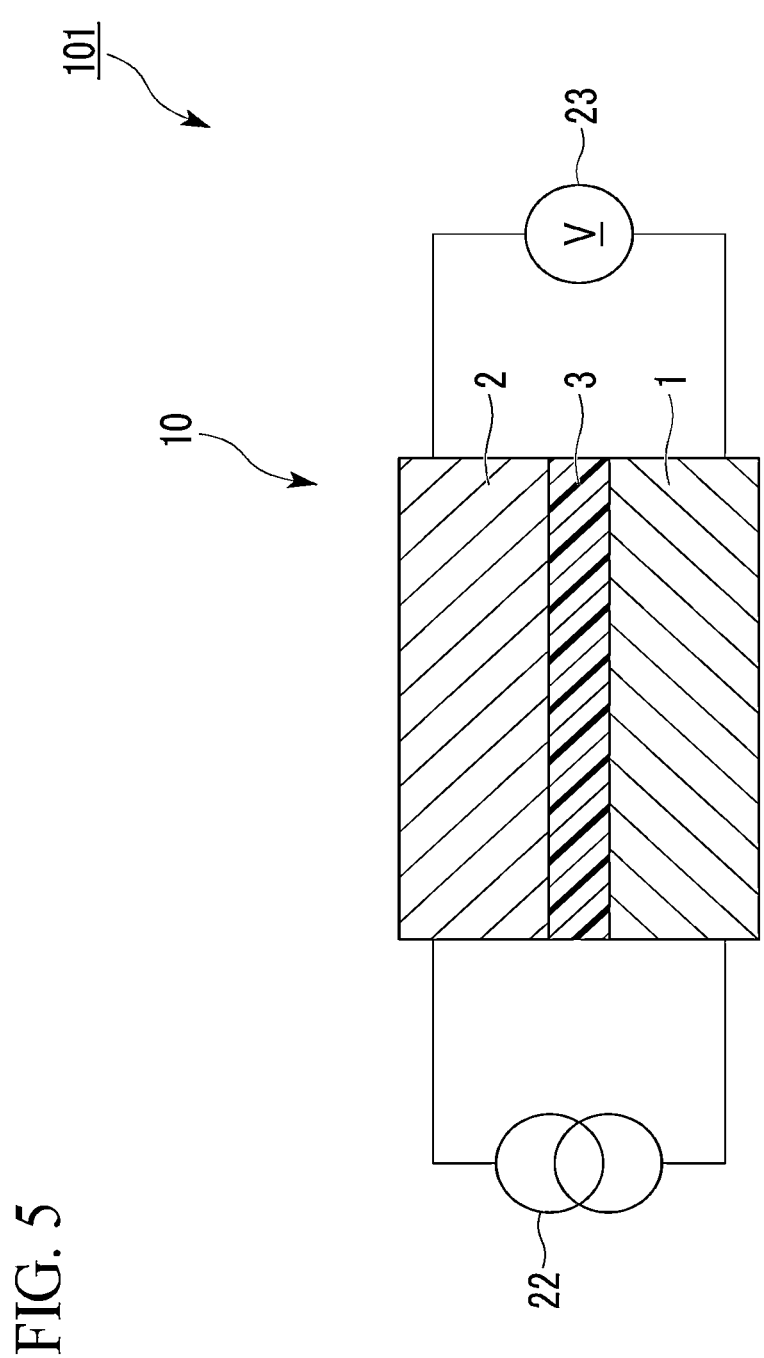
FIG. 5 is a cross-sectional view of a magnetic recording element according to Application Example 2.

FIG. 5 is a cross-sectional view of a magnetic recording element 101 according to Application Example 2. FIG. 5 is a cross-sectional view of the magnetic recording element 101 cut in the lamination direction.

As illustrated in FIG. 5, the magnetic recording element 101 has the magnetoresistance effect element 10, a power source 22, and a measurement portion 23. The power source 22 applies a potential difference in the lamination direction of the magnetoresistance effect element 10. For example, the power source 22 is a DC power source. The measurement portion 23 measures the resistance value in the lamination direction of the magnetoresistance effect element 10.

When a potential difference occurs between the first ferromagnetic layer 1 and the second ferromagnetic layer 2 by the power source 22, a current flows in the lamination direction of the magnetoresistance effect element 10. A current is subjected to spin polarization when it passes through the first ferromagnetic layer 1 and becomes a spin-polarized current. The spin-polarized current arrives at the second ferromagnetic layer 2 via the nonmagnetic layer 3. The magnetization of the second ferromagnetic layer 2 is subjected to magnetization reversal upon reception of a spin transfer torque (STT) of the spin-polarized current. As the relative angle between the direction of the magnetization of the first ferromagnetic layer 1 and the direction of the magnetization of the second ferromagnetic layer 2 changes, the resistance value in the lamination direction of the magnetoresistance effect element 10 changes. The resistance value in the lamination direction of the magnetoresistance effect element 10 is read by the measurement portion 23. That is, the magnetic recording element 101 illustrated in FIG. 5 is a spin transfer torque (STT) type magnetic recording element.

Since the magnetic recording element 101 illustrated in FIG. 5 has at least one of the first ferromagnetic layer 1 and the second ferromagnetic layer 2 including an alloy obtained by adding an additive element to a Heusler alloy and has a high MR ratio, it has excellent data stability.

Figure 6:
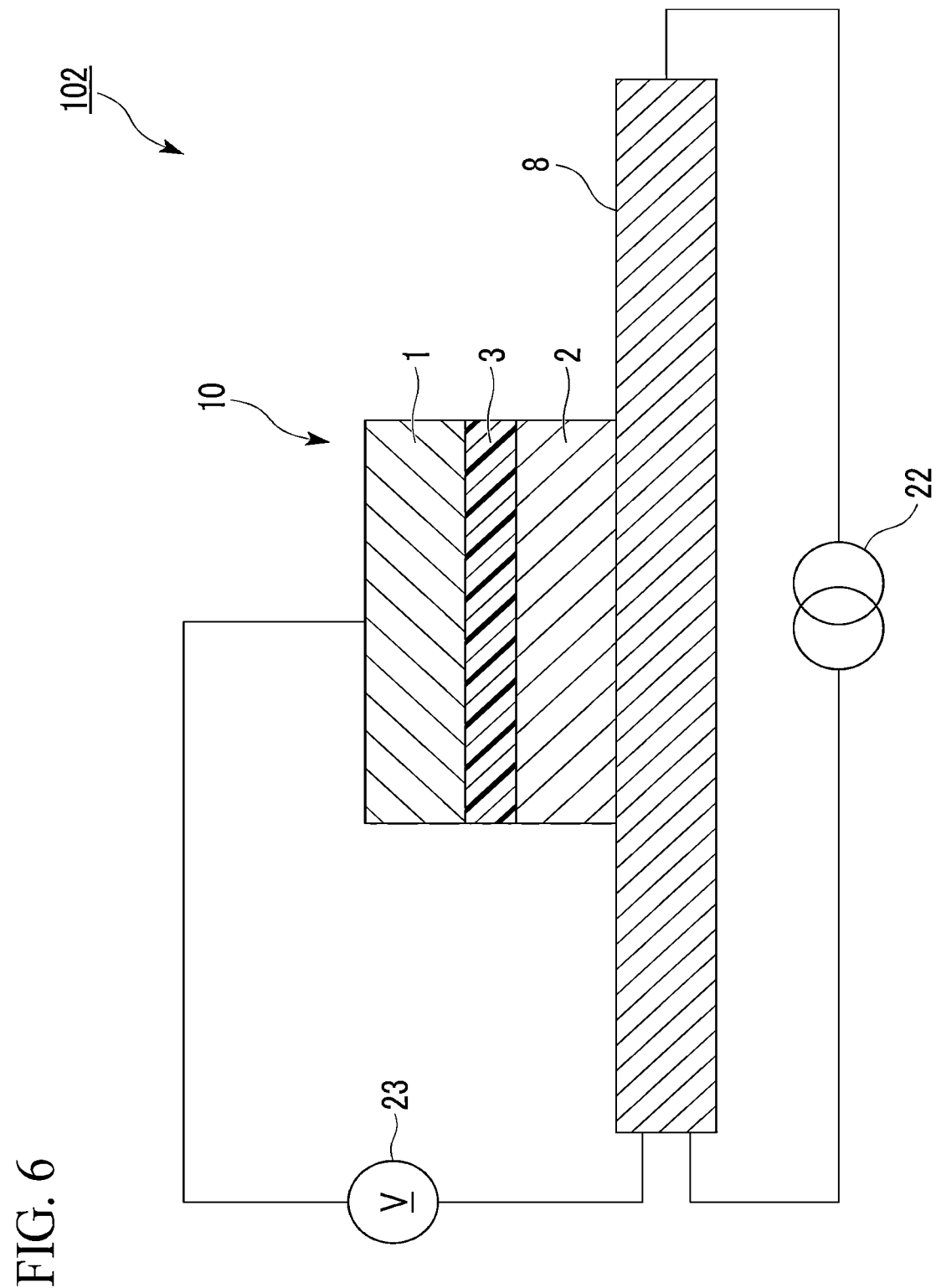
FIG. 6 is a cross-sectional view of a magnetic recording element according to Application Example 3.

FIG. 6 is a cross-sectional view of a magnetic recording element 102 according to Application Example 3. FIG. 6 is a cross-sectional view of the magnetic recording element 102 cut in the lamination direction.

As illustrated in FIG. 6, the magnetic recording element 102 has the magnetoresistance effect element 10, a spin-orbit torque wiring 8, the power source 22, and the measurement portion 23. For example, the spin-orbit torque wiring 8 comes into contact with the second ferromagnetic layer 2. The spin-orbit torque wiring 8 extends in one direction of the in-plane direction. The power source 22 is connected to a first end and a second end of the spin-orbit torque wiring 8. The first end and the second end sandwich the magnetoresistance effect element 10 therebetween in a plan view. A writing current flows from the power source 22 along the spin-orbit torque wiring 8. The measurement portion 23 measures the resistance value in the lamination direction of the magnetoresistance effect element 10.

When a potential difference is generated between the first end and the second end of the spin-orbit torque wiring 8 by the power source 22, a current flows in the in-plane direction of the spin-orbit torque wiring 8. The spin-orbit torque wiring 8 has a function of generating a spin current by means of a spin Hall effect when a current flows. For example, the spin-orbit torque wiring 8 includes any of a metal, an alloy, an intermetallic compound, a metal boride, a metal carbide, a metal silicide, and a metal phosphide having a function of generating a spin current by means of a spin Hall effect when a current flows. For example, the wiring includes a non-magnetic metal having d electrons or f electrons in an outermost shell and having the atomic number of 39 or larger.

When a current flows in the in-plane direction of the spin-orbit torque wiring 8, a spin Hall effect is manifested due to spin-orbit interaction. A spin Hall effect is a phenomenon in which moving spins are bent in a direction orthogonal to a flowing direction of a current. A spin Hall effect generates an uneven distribution of spins inside the spin-orbit torque wiring 8 and induces a spin current in a thickness direction of the spin-orbit torque wiring 8. Spins are injected from the spin-orbit torque wiring 8 into the second ferromagnetic layer 2 due to the spin current.

Spins injected into the second ferromagnetic layer 2 impart a spin-orbit torque (SOT) to the magnetization of the second ferromagnetic layer 2. The second ferromagnetic layer 2 is subjected to magnetization reversal upon reception of an spin-orbit torque (SOT). As the relative angle between the direction of the magnetization of the first ferromagnetic layer 1 and the direction of the magnetization of the second ferromagnetic layer 2 changes, the resistance value in the lamination direction of the magnetoresistance effect element 10 changes. The resistance value in the lamination direction of the magnetoresistance effect element 10 is read by the measurement portion 23. That is, the magnetic recording element 102 illustrated in FIG. 6 is a spin-orbit torque (SOT) type magnetic recording element.

Since the magnetic recording element 102 illustrated in FIG. 6 has at least one of the first ferromagnetic layer 1 and the second ferromagnetic layer 2 including an alloy obtained by adding an additive element to a Heusler alloy and has a high MR ratio, it has excellent data stability.

Figure 7:
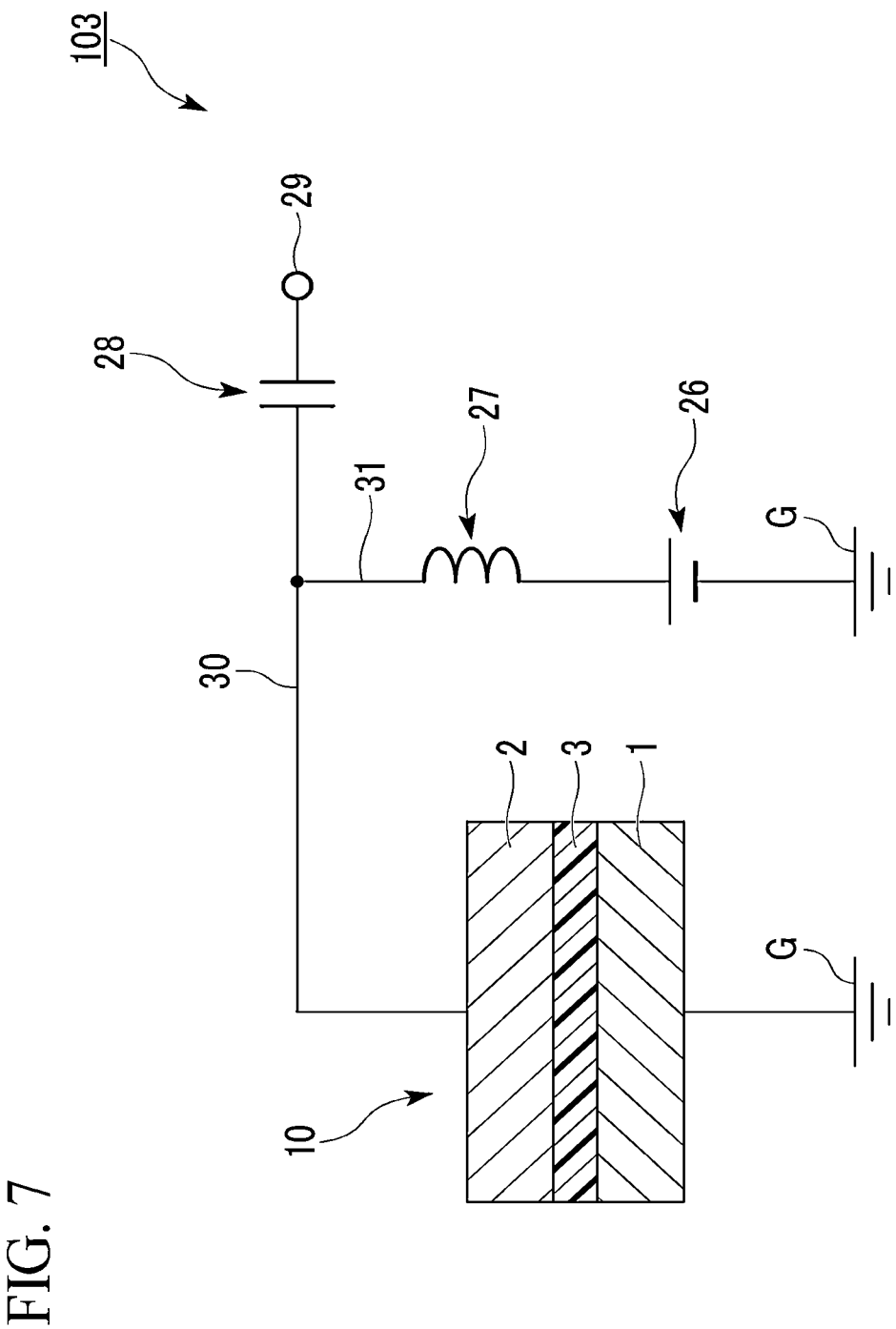
FIG. 7 is a cross-sectional view of a high-frequency device according to Application Example 4.

FIG. 7 is a schematic view of a high-frequency device 103 according to Application Example 4. As illustrated in FIG. 7, the high-frequency device 103 has the magnetoresistance effect element 10, a DC power source 26, an inductor 27, a capacitor 28, an output port 29, and wirings 30 and 31.

The wiring 30 connects the magnetoresistance effect element 10 and the output port 29 to each other. The wiring 31 branches from the wiring 30 and reaches a ground G via the inductor 27 and the DC power source 26. Regarding the DC power source 26, the inductor 27, and the capacitor 28, known elements can be used. The inductor 27 blocks a high-frequency component of a current and allows an invariant component of a current. The capacitor 28 allows a high-frequency component of a current and blocks an invariant component of a current. The inductor 27 is provided in a part where it is desired to curb a flow of a high-frequency current, and the capacitor 28 is provided in a part where it is desired to curb a flow of a direct current.

When an alternating current or an AC magnetic field is applied to the ferromagnetic layer included in the magnetoresistance effect element 10, the magnetization of the second ferromagnetic layer 2 exhibits motion of precession. The magnetization of the second ferromagnetic layer 2 strongly vibrates when a high-frequency current or a frequency of a high-frequency magnetic field applied to the second ferromagnetic layer 2 is near a ferromagnetic resonance frequency of the second ferromagnetic layer 2 and does not vibrate very much at a frequency away from a ferromagnetic resonance frequency of the second ferromagnetic layer 2. This phenomenon is referred to as a ferromagnetic resonance phenomenon.

The resistance value of the magnetoresistance effect element 10 varies depending on vibration of the magnetization of the second ferromagnetic layer 2. The DC power source 26 applies a direct current to the magnetoresistance effect element 10. A direct current flows in the lamination direction of the magnetoresistance effect element 10. A direct current passes through the wirings 30 and 31 and the magnetoresistance effect element 10 and flows to the ground G. The potential of the magnetoresistance effect element 10 varies in accordance with Ohm's law. A high-frequency signal is output from the output port 29 in response to a change in potential of the magnetoresistance effect element 10 (a change in resistance value).

Since the high-frequency device 103 illustrated in FIG. 7 has at least one of the first ferromagnetic layer 1 and the second ferromagnetic layer 2 including an alloy obtained by adding an additive element to a Heusler alloy and has a high MR ratio, it is possible to transmit a large high-frequency signal.

EXAMPLES

Example 1-1

The magnetoresistance effect elements illustrated in FIG. 1 were produced. The constitution of each layer was as follows.

Substrate: MgO single crystal
Base layer: a structure in which Ag having a film thickness of 100 nm and Cr having a film thickness of 20 nm were laminated in this order
First ferromagnetic layer 1: a Heusler alloy including an additive element
Kind of additive element: Ar
Concentration of additive element: 1.1 mol %
Composition of Heusler alloy: $Co_2Fe_{1.03}Ga_{0.41}Ge_{1.06}$
Film thickness: 10 nm
Nonmagnetic layer: Ag having a film thickness of 5 nm
Second ferromagnetic layer 2: a Heusler alloy including no additive element
Composition of Heusler alloy: $Co_2Fe_{1.03}Ga_{0.41}Ge_{1.06}$
Film thickness: 8 nm
Cap layer: Ru having a film thickness of 5 nm Each layer on the substrate was produced by a sputtering method. In-magnetic field heat treatment was performed after the magnetoresistance effect elements were formed. The heat treatment temperature during this in-magnetic field heat treatment was set to 300° C., and the strength of the applied magnetic field was set to 5 kOe.

The concentrations of the additive elements in the first ferromagnetic layer 1 and the second ferromagnetic layer 2 were measured through energy dispersive X-ray spectroscopy (EDS) using a transmission electron microscope (TEM) with respect to thin-piece samples which were produced using a focused ion beam.

In addition, after the magnetoresistance effect elements were produced, the space groups of the first ferromagnetic layer 1 and the second ferromagnetic layer 2 were measured. As a result, in each of the first ferromagnetic layer 1 and the second ferromagnetic layer 2, there was a region of a space group of Fm-3m or Pm-3m. In addition, when the crystal structure of each of the first ferromagnetic layer 1 and the second ferromagnetic layer 2 was checked, it was confirmed that the skeleton of the Heusler alloy was maintained and the additive element had permeated within the crystal lattice.

The MR ratio (magnetic resistance change rate) of the magnetoresistance effect element of Example 1 was measured. The MR ratio of Example 1 was 24.2%.

The MR ratio was evaluated by the following procedure. First, a shape suitable for measurement was formed using a fine processing technology such as EB lithography or ion milling. In a state in which a constant current was flowing in the lamination direction of the magnetoresistance effect element 10, a change in the resistance value of the magnetoresistance effect element 10 was measured by monitoring a voltage applied to the magnetoresistance effect element 10 with a voltmeter while sweeping a magnetic field from the outside to the magnetoresistance effect element 10. The resistance value when the directions of the magnetizations of the first ferromagnetic layer 1 and the second ferromagnetic layer 2 were parallel to each other and the resistance value when the directions of the magnetizations of the first ferromagnetic layer 1 and the second ferromagnetic layer 2 were anti-parallel to each other were measured, and calculation was performed by the following expression from the obtained resistance values. The MR ratio was measured at 300K (room temperature).

$$\text{MR ratio (\%)} = (R_{AP} - R_P)/R_P \times 100$$

$R_P$ is a resistance value when the directions of the magnetizations of the first ferromagnetic layer 1 and the second ferromagnetic layer 2 are parallel to each other, and RAP is a resistance value when the directions of the magnetizations of the first ferromagnetic layer 1 and the second ferromagnetic layer 2 are anti-parallel to each other.

Examples 1-2 to 1-4

Examples 1-2 to 1-4 differed from Example 1-1 in that the concentration of the additive element included in the first ferromagnetic layer 1 was changed. The concentration of the additive element in each Example was as follows.
Example 1-2: 3.4 mol %
Example 1-3: 4.4 mol %
Example 1-4: 6.3 mol %

Example 1-5

Example 1-5 differed from Example 1-1 in that Ar was also added to the second ferromagnetic layer 2 as an additive element and the concentration of the additive element Ar in the first ferromagnetic layer 1 was changed. Ar of 6.1 mol % was added to the first ferromagnetic layer 1, and Ar of 3.3 mol % was added to the second ferromagnetic layer 2.

Example 1-6

Example 1-6 differed from Example 1-1 in that different additive elements were respectively added to the first ferromagnetic layer 1 and the second ferromagnetic layer 2 and the concentration of the additive element Ar in the first ferromagnetic layer 1 was changed. Ar of 5.7 mol % was added to the first ferromagnetic layer 1, and Kr of 2.9 mol % was added to the second ferromagnetic layer 2.

Example 1-7

Example 1-7 differed from Example 1-1 in that two kinds of additive elements were added to the first ferromagnetic layer 1 and one kind of an additive element was added to the second ferromagnetic layer 2. Ar of 3.3 mol % and Kr of 2.5 mol % were added to the first ferromagnetic layer 1, and Kr of 2.8 mol % was added to the second ferromagnetic layer 2.

Examples 2-1 to 2-4

Examples 2-1 to 2-4 differed from Example 1-1 in that the element added to the first ferromagnetic layer 1 was F. The concentration of the additive element in each Example was as follows.
Example 2-1: 0.5 mol %
Example 2-2: 0.8 mol %
Example 2-3: 1.3 mol %
Example 2-4: 2.2 mol %

Examples 3-1 to 3-4

Examples 3-1 to 3-4 differed from Example 1-1 in that the element added to the first ferromagnetic layer 1 was O. The concentration of the additive element in each Example was as follows.
Example 3-1: 0.4 mol %
Example 3-2: 0.7 mol %
Example 3-3: 1.2 mol %
Example 3-4: 2.3 mol %

Examples 4-1 to 4-4

Examples 4-1 to 4-4 differed from Example 1-1 in that the element added to the first ferromagnetic layer 1 was N. The concentration of the additive element in each Example was as follows.
Example 4-1: 0.6 mol %
Example 4-2: 0.9 mol %
Example 4-3: 1.3 mol %
Example 4-4: 2.3 mol %

Examples 5-1 to 5-4

Examples 5-1 to 5-4 differed from Example 1-1 in that the element added to the first ferromagnetic layer 1 was Kr. The concentration of the additive element in each Example was as follows.
Example 5-1: 0.8 mol %
Example 5-2: 1.5 mol %
Example 5-3: 3.2 mol %
Example 5-4: 4.8 mol %

Examples 6-1 to 6-4

Examples 6-1 to 6-4 differed from Example 1-1 in that the element added to the first ferromagnetic layer 1 was Xe. The concentration of the additive element in each Example was as follows.
Example 6-1: 0.7 mol %
Example 6-2: 1.4 mol %
Example 6-3: 2.2 mol %
Example 6-4: 3.4 mol %

Examples 7 to 11

Examples 7 to 11 differed from Example 1-1 in the element added to the first ferromagnetic layer 1. The additive element and the concentration in each Example are shown below in the notation of "additive element/concentration". The composition analysis of Examples 7 and 8 was performed using an SIMS, and the composition analysis of Examples 9, 10, and 11 was performed using EDS.
Example 7: H/1.8 mol %
Example 8: He/1.2 mol %
Example 9: Ne/2.1 mol %
Example 10: P/2.3 mol %
Example 11: Cl/1.5 mol %

Comparative Example 1

Comparative Example 1 differed from Example 1-1 in that nothing was added to the first ferromagnetic layer 1.

In addition, the MR ratios (magnetic resistance change rates) of the magnetoresistance effect elements of Examples 1-1 to 11 and Comparative Example 1 were measured. The results are summarized in Tables 1 and 2.

TABLE 1

| | Additive element to first ferromagnetic layer 1 | | | | Additive element to second ferromagnetic layer 2 | | MR ratio (%) |
|---|---|---|---|---|---|---|---|
| | First element | Concentration of first element (mol %) | Second element | Concentration of second element (mol %) | First element | Concentration of first element (mol %) | |
| Example 1-1 | Ar | 1.1 | — | — | — | — | 24.2 |
| Example 1-2 | Ar | 3.4 | — | — | — | — | 24.7 |
| Example 1-3 | Ar | 4.4 | — | — | — | — | 24.9 |
| Example 1-4 | Ar | 6.3 | — | — | — | — | 25.2 |
| Example 1-5 | Ar | 6.1 | — | — | Ar | 3.3 | 26.7 |
| Example 1-6 | Ar | 5.7 | — | — | Kr | 2.9 | 27.7 |
| Example 1-7 | Ar | 3.3 | Kr | 2.5 | Kr | 2.8 | 28.6 |
| Example 2-1 | F | 0.5 | — | — | — | — | 27.3 |
| Example 2-2 | F | 0.8 | — | — | — | — | 26.9 |
| Example 2-3 | F | 1.3 | — | — | — | — | 27.8 |
| Example 2-4 | F | 2.2 | — | — | — | — | 27.4 |
| Example 3-1 | O | 0.4 | — | — | — | — | 26.1 |
| Example 3-2 | O | 0.7 | — | — | — | — | 26.3 |
| Example 3-3 | O | 1.2 | — | — | — | — | 26.6 |
| Example 3-4 | O | 2.3 | — | — | — | — | 26.4 |

TABLE 2

| | Additive element to first ferromagnetic layer 1 | | | | Additive element to second ferromagnetic layer 2 | | MR ratio (%) |
|---|---|---|---|---|---|---|---|
| | First element | Concentration of first element (mol %) | Second element | Concentration of second element (mol %) | First element | Concentration of first element (mol %) | |
| Example 4-1 | N | 0.6 | — | — | — | — | 26.2 |
| Example 4-2 | N | 0.9 | — | — | — | — | 26.2 |
| Example 4-3 | N | 1.3 | — | — | — | — | 27.1 |
| Example 4-4 | N | 2.3 | — | — | — | — | 27.0 |
| Example 5-1 | Kr | 0.8 | — | — | — | — | 25.2 |
| Example 5-2 | Kr | 1.5 | — | — | — | — | 25.8 |
| Example 5-3 | Kr | 3.2 | — | — | — | — | 26.3 |
| Example 5-4 | Kr | 4.8 | — | — | — | — | 26.2 |
| Example 6-1 | Xe | 0.7 | — | — | — | — | 25.7 |
| Example 6-2 | Xe | 1.4 | — | — | — | — | 26.3 |
| Example 6-3 | Xe | 2.2 | — | — | — | — | 27.1 |
| Example 6-4 | Xe | 3.4 | — | — | — | — | 26.8 |
| Example 7 | H | 1.8 | — | — | — | — | 22.8 |
| Example 8 | He | 1.2 | — | — | — | — | 22.7 |
| Example 9 | Ne | 2.1 | — | — | — | — | 22.9 |
| Example 10 | P | 2.3 | — | — | — | — | 23.1 |
| Example 11 | Cl | 1.5 | — | — | — | — | 23.4 |
| Comparative Example 1 | Absent | 0 (0.01 or less) | — | — | — | — | 22.1 |

REFERENCE SIGNS LIST

1 First ferromagnetic layer
2 Second ferromagnetic layer
3 Nonmagnetic layer
4 Intermediate layer
8 Spin-orbit torque wiring
10, 11 Magnetoresistance effect element
21 Resistance measuring instrument
22 Power source
23 Measurement portion
26 DC power source
27 Inductor
28 Capacitor
29 Output port
30, 31 Wiring
100, 101, 102 Magnetic recording element
103 High-frequency device

What is claimed is:

1. A magnetoresistance effect element comprising:
   a first ferromagnetic layer;
   a second ferromagnetic layer; and
   a nonmagnetic layer provided between the first ferromagnetic layer and the second ferromagnetic layer,
   wherein at least one of the first ferromagnetic layer and the second ferromagnetic layer has an alloy obtained by adding an additive element to a Heusler alloy, and
   wherein the additive element is any one or more elements selected from the group consisting of H, He, Ne, Cl, Ar, Kr, and Xe.

2. The magnetoresistance effect element according to claim 1,
   wherein both the first ferromagnetic layer and the second ferromagnetic layer have an alloy obtained by adding the additive element to the Heusler alloy.

3. The magnetoresistance effect element according to claim 2, wherein the additive element included in the first ferromagnetic layer and the additive element included in the second ferromagnetic layer differ from each other.

4. The magnetoresistance effect element according to claim 2,
wherein the first ferromagnetic layer and the second ferromagnetic layer differ from each other in concentration of the additive element contained therein.

5. The magnetoresistance effect element according to claim 2,
wherein the first ferromagnetic layer and the second ferromagnetic layer differ from each other in the number of kinds of the additive elements contained therein.

6. The magnetoresistance effect element according to claim 1,
wherein the additive element is any one or more elements selected from the group consisting of Ar, Kr, and Xe.

7. The magnetoresistance effect element according to claim 1,
wherein the alloy is an interstitial solid solution in which the additive element has permeated within a crystal lattice of the Heusler alloy.

8. The magnetoresistance effect element according to claim 1,
wherein the alloy includes the additive element at a ratio of 0.4% to 6.3% of a total molar ratio.

9. The magnetoresistance effect element according to claim 1,
wherein the alloy includes a region of any space group of Fm-3m, Pm-3m, F-43m, I4/mmm, and P4/mmm.

10. The magnetoresistance effect element according to claim 1,
wherein the nonmagnetic layer includes a metal or an alloy including any element selected from the group consisting of Cu, Au, and Ag.

11. The magnetoresistance effect element according to claim 10,
wherein the nonmagnetic layer includes the additive element.

12. The magnetoresistance effect element according to claim 1,
wherein the Heusler alloy is expressed by $Co_2Fe_{\beta1}Ga_{\beta2}Ge_{\beta3}$ ... (1), and
wherein $2.3 \leq \beta1+\beta2+\beta3 \leq 3.0$, $\beta1 < \beta2+\beta3$, $0.5 < \beta1 < 1.9$, $0.1 \leq \beta2 \leq 0.8$, and $0.1 \leq \beta3 \leq 1.5$ are satisfied in Expression (1).

13. The magnetoresistance effect element according to claim 1,
wherein the Heusler alloy is expressed by $(Mn_{1-x}Co_x)_yGe_{1-y}$ (2), and
wherein Expression (2) satisfies $0 \leq x \leq 1/3$ and $1/2 < y \leq 3/4$.

14. The magnetoresistance effect element according to claim 1,
wherein an intermediate layer including a NiAl alloy is provided between at least one of the first ferromagnetic layer and the second ferromagnetic layer, and the nonmagnetic layer.

15. The magnetoresistance effect element according to claim 14,
wherein a thickness of the intermediate layer is 0.63 nm or shorter.

16. The magnetoresistance effect element according to claim 1,
wherein the nonmagnetic layer includes the additive element.

* * * * *